United States Patent
Zull et al.

(10) Patent No.: US 9,165,816 B2
(45) Date of Patent: Oct. 20, 2015

(54) METHOD FOR SINGULATING A COMPONENT COMPOSITE ASSEMBLY

(75) Inventors: Heribert Zull, Regensburg (DE);
Korbinian Perzlmaier, Regensburg (DE); Andreas Ploessl, Regensburg (DE); Thomas Veit, Mintraching (DE); Mathias Kaempf, Burglengenfeld (DE); Jens Dennemarck, Regensburg (DE); Bernd Boehm, Obertraubling (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 59 days.

(21) Appl. No.: 14/002,754

(22) PCT Filed: Mar. 16, 2012

(86) PCT No.: PCT/EP2012/054714
§ 371 (c)(1),
(2), (4) Date: Nov. 8, 2013

(87) PCT Pub. No.: WO2012/130643
PCT Pub. Date: Oct. 4, 2012

(65) Prior Publication Data
US 2014/0080287 A1 Mar. 20, 2014

(30) Foreign Application Priority Data

Mar. 31, 2011 (DE) .......... 10 2011 015 725

(51) Int. Cl.
*H01L 21/683* (2006.01)
*H01L 21/78* (2006.01)
(Continued)

(52) U.S. Cl.
CPC ............ *H01L 21/6836* (2013.01); *H01L 21/78* (2013.01); *H01L 21/782* (2013.01);
(Continued)

(58) Field of Classification Search
CPC . H01L 21/7806; H01L 21/782; H01L 21/784; H01L 21/6836; H01L 21/6835; H01L 33/0095; H01L 33/0079; H01L 221/68327; H01L 31/1804; H01L 31/022425; H01S 5/0202; B23K 26/4075
USPC ............. 438/33, 25–26, 66–68, 73, 113–114, 438/463, 464
See application file for complete search history.

(56) References Cited

U.S. PATENT DOCUMENTS

| | | | |
|---|---|---|---|
| 5,994,205 | A | 11/1999 | Yamamoto et al. |
| 6,420,242 | B1 | 7/2002 | Cheung et al. |

(Continued)

FOREIGN PATENT DOCUMENTS

| | | |
|---|---|---|
| DE | 102004030603 | 2/2005 |
| DE | 10200743902 | 3/2009 |

(Continued)

OTHER PUBLICATIONS

Arita; "Panasonic's Plasma Dicing Technology"; Suss Report pp. 4-7 (2010).

(Continued)

*Primary Examiner* — Thanhha Pham
(74) *Attorney, Agent, or Firm* — Occhiuti & Rohlicek LLP

(57) ABSTRACT

A method relates to separating a component composite into a plurality of component regions, wherein the component composite is provided having a semiconductor layer sequence comprising a region for generating or for receiving electromagnetic radiation. The component composite is mounted on a rigid subcarrier. The component composite is separated into the plurality of component regions, wherein one semiconductor body is produced from the semiconductor layer sequence for each component region. The component regions are removed from the subcarrier.

19 Claims, 7 Drawing Sheets

(51) Int. Cl.
*H01L 21/784* (2006.01)
*H01L 21/782* (2006.01)
*H01L 31/18* (2006.01)
*H01L 33/00* (2010.01)
*H01S 5/02* (2006.01)

(52) U.S. Cl.
CPC .......... *H01L21/784* (2013.01); *H01L 21/7806* (2013.01); *H01L 31/18* (2013.01); *H01L 33/0095* (2013.01); *H01L 33/0079* (2013.01); *H01S 5/0201* (2013.01)

(56) References Cited

U.S. PATENT DOCUMENTS 7,329,587 B2 * 2/2008 Bruederl et al. .............. 438/458

2004/0137662 A1 7/2004 Yanagisawa et al.
2005/0242365 A1 11/2005 Yoo
2008/0315220 A1 12/2008 Lee et al.
2010/0289040 A1 11/2010 Seo et al.

FOREIGN PATENT DOCUMENTS

| | | |
|---|---|---|
| EP | 2302703 | 3/2011 |
| WO | WO2005/008740 | 1/2005 |
| WO | WO2009/084857 | 7/2009 |

OTHER PUBLICATIONS

Heinze et al.; "How to Make a Perfect Chip"; Mikroproduktion; Carl Hanser Verlag Munchen pp. 45-50 (2008).

* cited by examiner

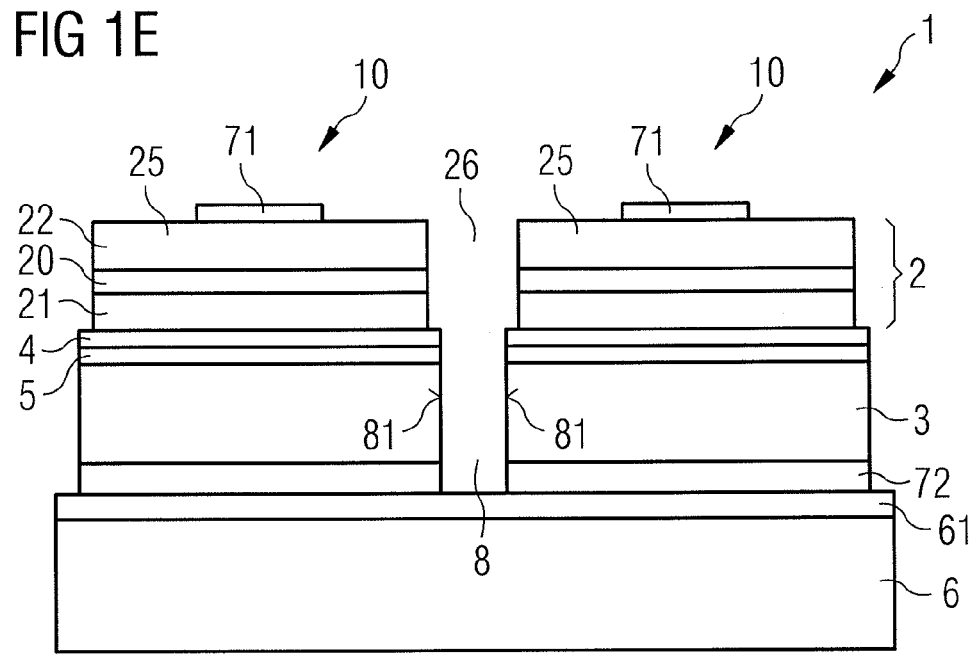
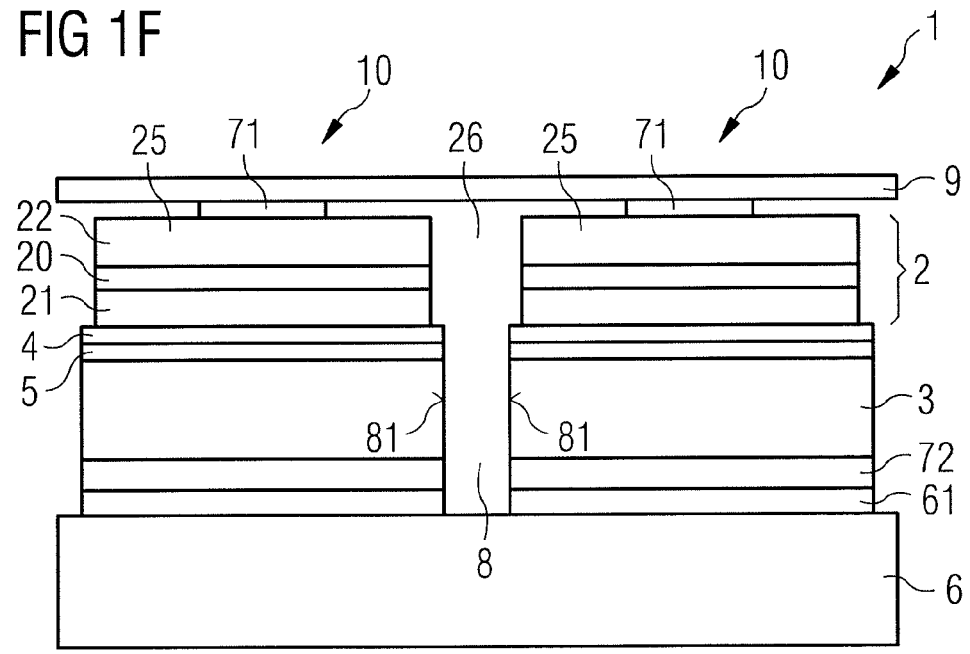

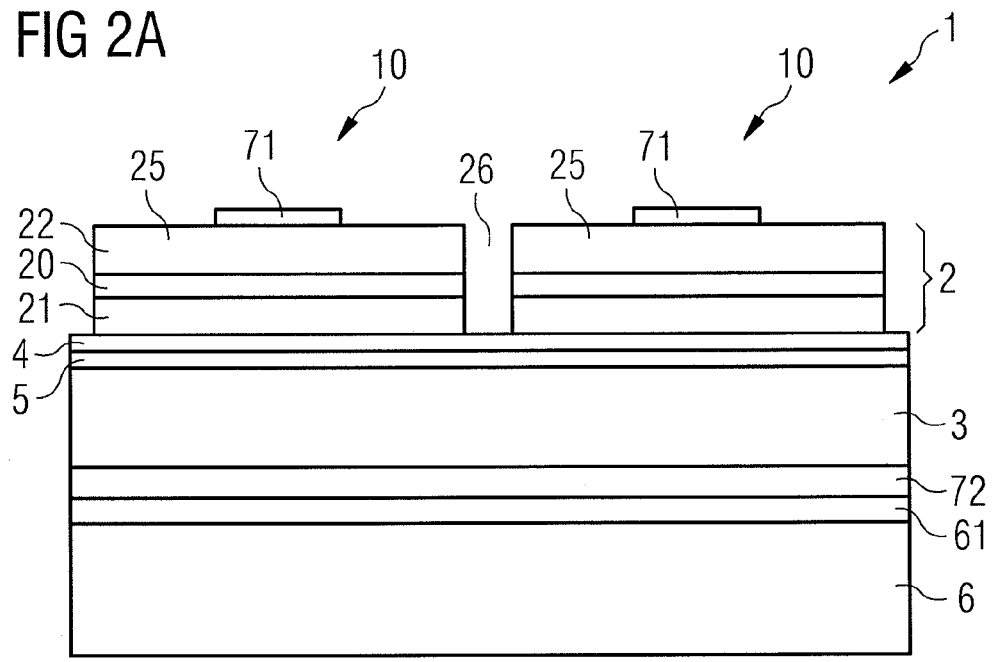
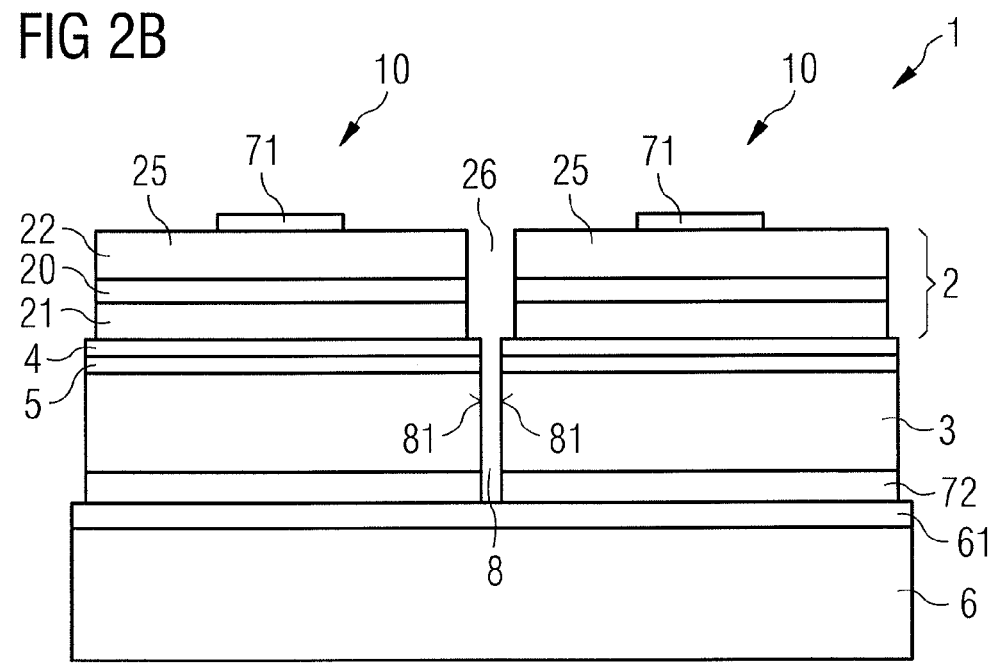

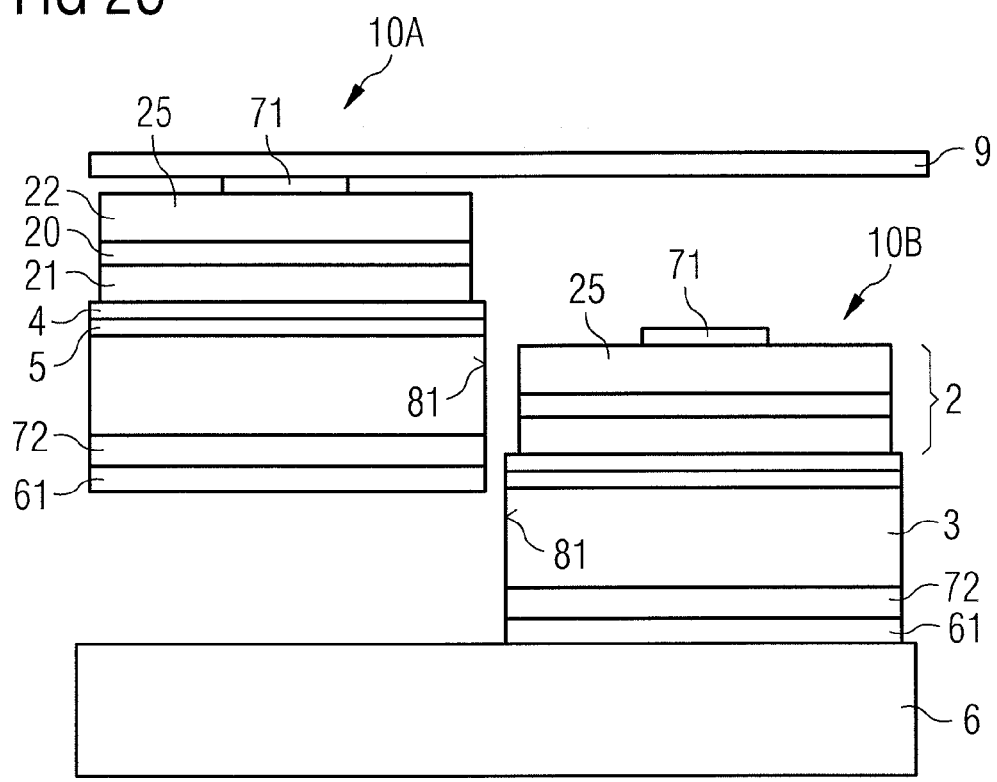

METHOD FOR SINGULATING A COMPONENT COMPOSITE ASSEMBLY

CROSS-REFERENCE TO RELATED APPLICATIONS

This application is the National Stage of International Application No. PCT/EP2012/054714, filed on Mar. 16, 2012, which claims the priority of German Application No. 10 2011 015 725.5, filed on Mar. 31, 2011. The contents of both applications are hereby incorporated by reference in their entirety.

FIELD OF DISCLOSURE

The present application relates to a method for singulating a component composite assembly into a plurality of component regions.

BACKGROUND

During the production of semiconductor components, for example optoelectronic semiconductor chips, the semiconductor wafers to be singulated can be arranged on a carrier film and subsequently be subjected to a singulation process, for example sawing or laser separation. However, for production processes that require a high chemical loading capacity and/or a high thermal loading capacity of, for example, 250° or more, such films are not suitable or at least are suitable only to a limited extent.

SUMMARY

It is an object to specify a method by which a singulation can be obtained reliably and in an improved manner.

This object is achieved by means of the subject matter of patent claim 1. Configurations and developments are the subject matter of the dependent patent claims.

In an embodiment, in a method for singulating a component composite assembly into a plurality of component regions, a component composite assembly having a semiconductor layer sequence is provided, wherein the semiconductor layer sequence preferably has an active region provided for generating or for receiving electromagnetic radiation. The component composite assembly is fixed to a rigid auxiliary carrier. The component composite assembly is singulated into the plurality of component regions, wherein for each component region a respective semiconductor body emerges from the semiconductor layer sequence. The component regions are removed from the auxiliary carrier.

A semiconductor layer sequence is generally understood to mean a succession of preferably epitaxial semiconductor layers, which can be unstructured or structured along a main extension plane of the semiconductor layer sequence. By way of example, the semiconductor layer sequence can already have a structuring that subdivides the semiconductor layer sequence into the semiconductor bodies. Alternatively or supplementarily, the semiconductor layer sequence can have a structuring, for example cutouts for externally making electrical contact with one or more semiconductor layers of the semiconductor layer sequence. Furthermore, on the semiconductor layer sequence it is also possible to form at least one structured or unstructured contact layer provided for externally making electrical contact with the semiconductor bodies.

A rigid auxiliary carrier is generally understood to mean, in particular, an auxiliary carrier embodied with a thickness such that it carries its own weight and preferably also the weight of the component composite assembly. The weight force of the auxiliary carrier alone therefore does not bring about significant deformation of the auxiliary carrier. By contrast, a flexible film that is tensioned before the component composite assembly is fixed, for example by means of a fixing to a tensile frame, should not be regarded as a rigid auxiliary carrier.

In contrast to a flexible film, the rigid auxiliary carrier can furthermore be distinguished by a high thermal stability and/or a high chemical stability with respect to etching processes.

In a preferred configuration, the component composite assembly is fixed on the auxiliary carrier by means of a metallic connection. This can be effected for example by means of soldering, eutectic bonding, joining by means of isothermal solidification (transient liquid phase bonding) or by means of a thermo compression method. Such a metallic connection can be distinguished by a high stability even at comparatively high temperatures of, for example, 200° C. or more.

After singulation, the component regions are removed from the auxiliary carrier preferably by means of a laser detachment method (laser lift-off).

The removal of the component regions can be effected in such a way that the component regions are selectively removed from the auxiliary carrier. That is to say that, during the method, the component regions can also be removed from the auxiliary carrier individually or in groups, while other component regions can at least initially remain on the auxiliary carrier. A laser detachment method is particularly suitable for such a selective removal of component regions.

In a preferred configuration, before the removal of the component regions from the auxiliary carrier, side faces of the component regions are formed by means of a plasma method. In contrast to a flexible carrier, the rigid auxiliary carrier can withstand the comparatively high temperatures that occur in such a plasma method. The side faces delimit the component regions after the complete conclusion of the singulation step in a lateral direction running along a main extension plane of the semiconductor layers of the semiconductor body.

In a plan view of the component regions, therefore, no region of the component regions, in particular no region of the semiconductor layer sequence, extends beyond one of the side faces.

In a configuration variant, the component composite assembly is severed by means of the plasma method during singulation. In contrast to a mechanical method such as sawing or cleaving, a plasma method does not require any restrictions to singulation directions that run straight during the singulation. A geometry of the component regions is freely selectable within comparatively wide limits. By way of example, the component regions in plan view can have a polygonal basic shape having more than four corners, for example a hexagonal basic shape and/or rounded corners. By means of rounded corners, a stress concentration can be avoided or at least reduced in order to lower the risk of fracture.

In an alternative configuration variant, the side faces of the component regions are formed by means of the plasma method after the component composite assembly has been singulated. The component composite assembly can be singulated for example mechanically, for instance by means of sawing, chemically, for instance by means of etching, or by means of coherent radiation, in particular by means of a laser separating method. In this case, damage that occurs during singulation can be removed by means of the plasma method. The side faces of the component regions are therefore formed in two stages in this case.

In a preferred configuration, the component regions are applied to a further auxiliary carrier before the removal of the auxiliary carrier. By way of example, the further auxiliary carrier can be a film. A preferably extensible film is particularly suitable for temporarily providing the component regions for further processing, for example for positioning the component regions in a housing or on a connection carrier. In a departure from this, it is also conceivable to use a further rigid carrier as further auxiliary carrier. If appropriate, further manufacturing steps can be carried out on the further auxiliary carrier.

In a preferred configuration, a sacrificial layer is applied to the auxiliary carrier before the component composite assembly is fixed. The sacrificial layer can be at least partly decomposed during the removal of the component regions from the auxiliary carrier. This can be achieved for example by means of the laser detachment method. Chemical decomposition of the sacrificial layer can also be employed.

In a further preferred configuration, the auxiliary carrier contains sapphire. The auxiliary carrier or at least one layer of the auxiliary carrier furthermore preferably consists of sapphire.

Sapphire is distinguished by a high optical transparency in the visible spectral range, such that, during a laser detachment method, the laser radiation can be radiated in through the auxiliary carrier. When a laser detachment method is used, the sacrificial layer is expediently embodied as absorbent for the laser radiation used. By way of example, the sacrificial layer can contain silicon nitride or consist of such a material. Some other, in particular dielectric, material can also be employed for the sacrificial layer, for example an oxide, for instance silicon oxide, or an oxynitride, for example silicon oxynitride.

In a preferred configuration, the component composite assembly is fixed on the auxiliary carrier by means of the metallic connection. Before the removal of the component regions, side faces of the component regions are formed by means of a plasma method, and the component regions are removed from the auxiliary carrier by means of a laser detachment method.

In a preferred configuration, the semiconductor layer sequence is provided on a carrier. When the component composite assembly is fixed to the rigid auxiliary carrier, the semiconductor layer sequence is preferably arranged on the side facing away from the auxiliary carrier. The carrier is preferably severed during the singulation of the component composite assembly. Consequently, the component regions arising as a result of the singulation each have a part of the carrier and a part of the semiconductor layer sequence. After singulation, the component regions are spaced apart from one another and are mechanically connected to one another only via the auxiliary carrier.

By contrast, the auxiliary carrier is preferably not severed during the singulation of the component composite assembly. It can thus be used anew as auxiliary carrier for a component composite assembly in a further method step.

The carrier can be a growth substrate for the semiconductor layer sequence. Alternatively, the carrier can differ from the growth substrate for the semiconductor layer sequence, wherein the growth substrate is preferably removed. In this case, the growth substrate has already been removed when the component composite assembly is fixed to the auxiliary carrier.

BRIEF DESCRIPTION OF THE DRAWINGS

Further features, configurations and expediencies will become apparent from the following description of the exemplary embodiments in conjunction with the figures.

In the figures:

FIGS. 1A to 1I show a first exemplary embodiment of a method for singulating a component composite assembly on the basis of intermediate steps illustrated schematically in sectional view; and FIGS. 2A to 2C show a second exemplary embodiment of a method for singulating a component composite assembly on the basis of intermediate steps illustrated schematically in sectional view.

Elements that are identical, of identical type or act identically are provided with the same reference signs in the figures.

The figures and the size relationships of the elements illustrated in the figures among one another should not be regarded as to scale. Moreover, individual elements may be illustrated with an exaggerated size in order to enable better illustration and/or in order to afford a better understanding.

An exemplary embodiment of a method for singulation in which a component composite assembly 1 is singulated into a plurality of component regions 10 is described by way of example with reference to FIGS. 1A to 1I. For simplified illustration, only an excerpt from the component composite assembly is shown, from which two component regions emerge. In this exemplary embodiment, the singulated component regions are in each case optoelectronic semiconductor chips, for example LED semiconductor chips, semiconductor laser chips or radiation receivers.

DETAILED DESCRIPTION

Figure 1A:
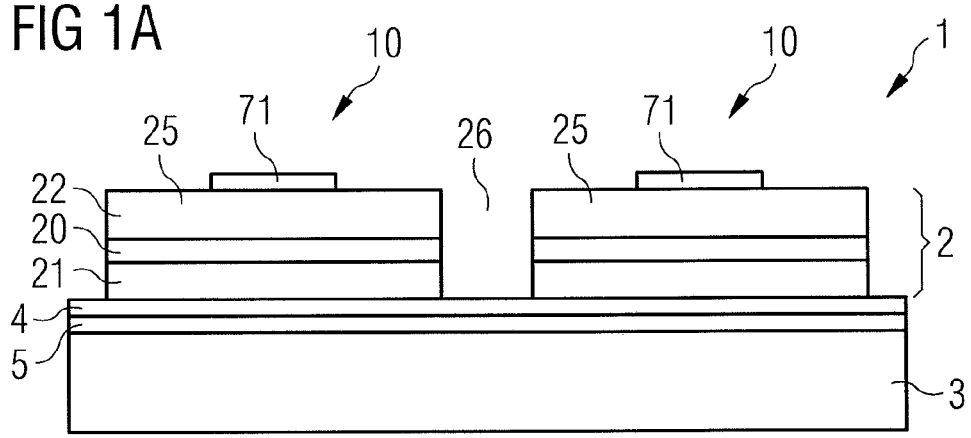
Figure 1A:
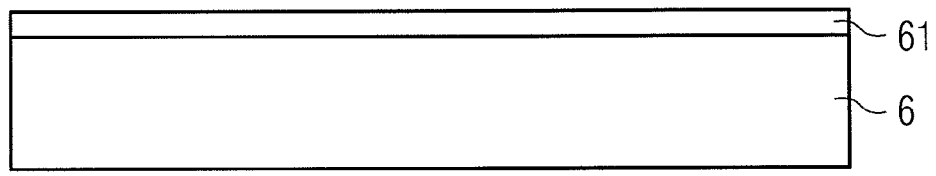

As illustrated in FIG. 1A, a component composite assembly 10 having a semiconductor layer sequence 2 is provided. The semiconductor layer sequence 2 has an active region 20 provided for generating or for receiving radiation, said active region being arranged between a first semiconductor layer 21 and a second semiconductor layer 22.

The semiconductor layer sequence is arranged on a carrier 3. The carrier 3 preferably contains a semiconductor material, for example germanium, silicon or gallium arsenide. A metallic carrier can also be employed.

The semiconductor layer sequence 2 is fixed to the carrier 3 by means of a connection layer 5, for example a solder layer or an electrically conductive adhesive layer. The carrier 3 differs from a growth substrate for the semiconductor layer sequence 2 which is preferably deposited epitaxially, and in the completed semiconductor chips serves for the mechanical stabilization of the semiconductor layer sequence 2. The growth substrate is no longer required for this purpose and is therefore removed.

The semiconductor layer sequence 2, in particular the active region 20, preferably contains a III-V compound semiconductor material.

III-V compound semiconductor materials are particularly suitable for generating radiation in the ultraviolet ($Al_xIn_yGa_{1-x-y}N$) through the visible ($Al_xIn_yGa_{1-x-y}N$, in particular for blue to green radiation, or $Al_xIn_yGa_{1-x-y}P$, in particular for yellow to red radiation) to the infrared ($Al_xIn_yGa_{1-x-y}As$) spectral range. Here in each case $0 \leq x \leq 1$, $0 \leq y \leq 1$ and $x+y \leq 1$ hold true, in particular where $x \neq 1$, $y \neq 1$, $x \neq 0$ and/or $y \neq 0$. With III-V compound semiconductor materials, in particular from the material systems mentioned, high internal quantum efficiencies can furthermore be obtained during the generation of radiation.

Semiconductor bodies 25 are formed from the semiconductor layer sequence 2. A respective separating trench 26 is formed between two adjacent semiconductor bodies, said trench at least partly, preferably completely, severing the semiconductor layer sequence in a vertical direction, that is to say in a direction running perpendicularly to a main extension plane of the semiconductor layers of the semiconductor layer sequence 2. Expediently, at least the active region 20 is severed by means of the separating trench.

A mirror layer 4 is provided between the semiconductor layer sequence 2, in particular between the first semiconductor layer 21, facing the carrier 3, and the connection layer 5, said mirror layer being provided for reflecting radiation generated in the active region 20 and emitted in the direction of the carrier 3 during operation. The mirror layer 4 preferably contains a metal, for example silver, aluminum, nickel, rhodium or palladium, or a metallic alloy comprising at least one of the materials mentioned. Silver and aluminum, in particular, are distinguished by a high reflectivity in the visible spectral range.

A first contact 71 is arranged on that side of the semiconductor layer sequence 2 which faces away from the carrier 3, expediently on each semiconductor body 25, said first contact being provided for externally making electrical contact in the completed semiconductor component region.

In order to protect the semiconductor bodies, a passivation layer can be formed (not explicitly illustrated) on the semiconductor bodies, in particular at the side faces of the semiconductor bodies which delimit the active region.

Furthermore, a rigid auxiliary carrier 6 is provided. The auxiliary carrier 6 is thick enough that it is self-supporting, that is to say can carry its own weight. In particular a radiation-transmissive material, for example sapphire, is suitable for the auxiliary carrier 6.

A sacrificial layer 61 is formed on the auxiliary carrier 6. The sacrificial layer is preferably embodied as radiation-absorbent. By way of example, a nitride, for instance silicon nitride, or an oxynitride, for instance silicon oxynitride is suitable for the sacrificial layer.

Figure 1B:
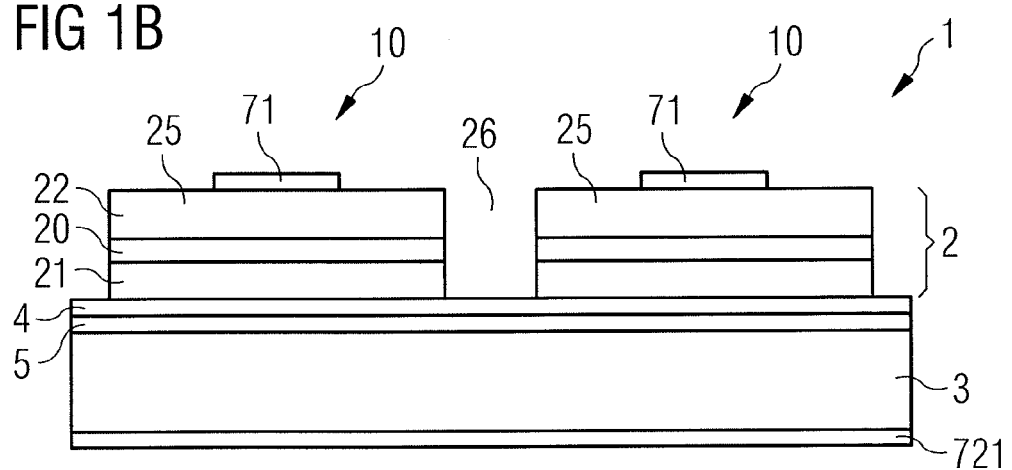
Figure 1B:
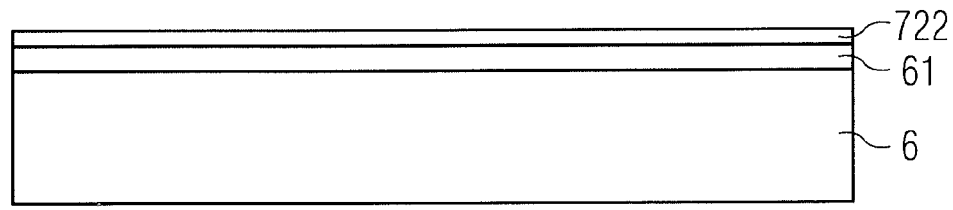

As illustrated in FIG. 1B, a first metallization layer 721 is applied on a side of the carrier 3 that faces away from the semiconductor layer sequence 2. A second metallization layer 722 is applied on the auxiliary carrier 6, in particular on that side of the sacrificial layer 61 which faces away from the auxiliary carrier. For example a PVD (Physical Vapor Deposition) method, for example sputtering, or a vapor deposition method is suitable for applying the metallization layers 721, 722.

The sacrificial layer 61 can be applied by means of a vapor deposition method, for example a PECVD (Plasma Enhanced Chemical Vapor Deposition) method or by means of a PVD method.

The component composite assembly 1 and the auxiliary carrier 6 are positioned with respect to one another in such a way that the first metallization layer 721 and the second metallization layer 722 directly adjoin one another. By means of these metallization layers, a mechanically stable metallic connection is formed between the auxiliary carrier 6 and the component composite assembly 1. By way of example, a soldering method, eutectic bonding, joining by means of isothermal solidification or a thermo compression method is suitable for producing the metallic connection.

Figure 1C:
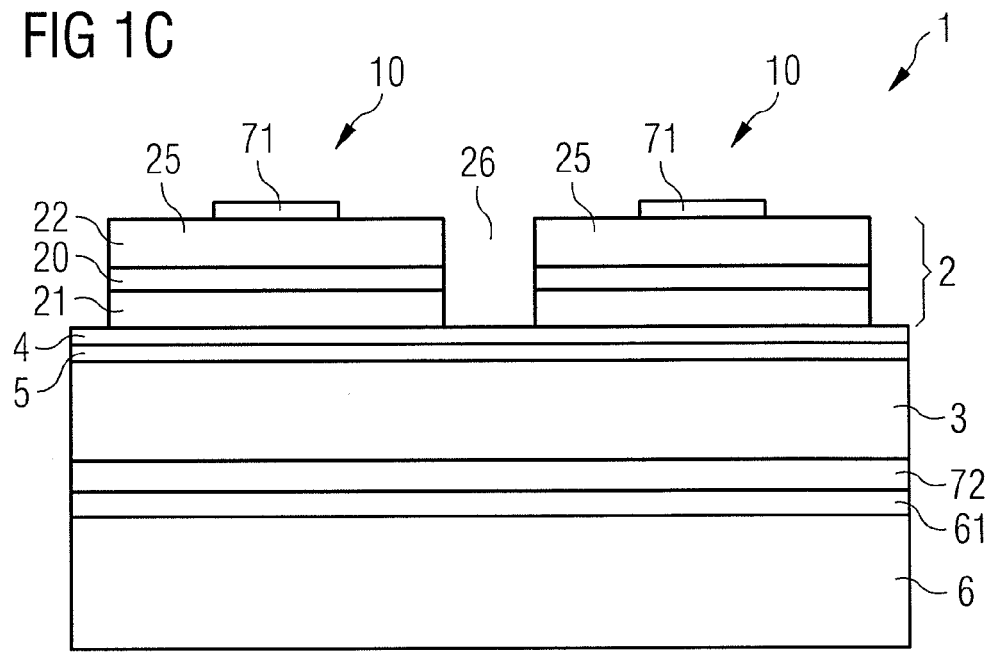

A second contact layer 72 emerges from the first metallization layer 721 and the second metallization layer 722, which second contact layer can serve for externally making electrical contact with the semiconductor chip in the completed semiconductor chip (FIG. 1C). The metallization layers 721, 722 preferably contain Au, Ti, Pt, Pd, Ag or Sn, or a metallic alloy comprising at least one of these materials.

Figure 1D:
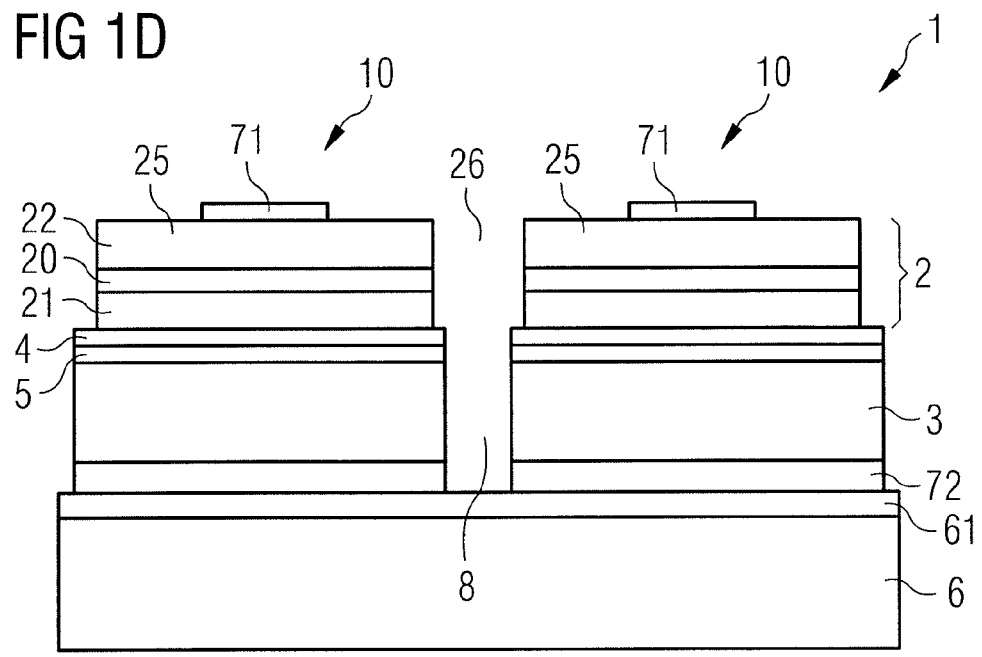

After connection to the auxiliary carrier 6, as illustrated in FIG. 1D, a singulation trench 8 is formed, which completely severs the component composite assembly 1 in a vertical direction. The singulation trench runs along the separating trench 26 in a plan view of the component composite assembly. Consequently, the component regions 10 are mechanically connected to one another only via the auxiliary carrier 6 after singulation. After severing, the sacrificial layer 61 can be unstructured, that is to say continuous, or structured. The singulation trench can therefore also extend into the sacrificial layer.

The singulation trench 8 is preferably formed by means of a laser separating method. Alternatively, a mechanical method, for example sawing, can also be employed.

The carrier 3 is severed during singulation. It has been found that not only the semiconductor body 25 having the active region 20 but also the side faces of the carrier of the singulated component region 10 are of great importance for the quality of the singulated component region. Damage in the material of the carrier that can arise as a result of the singulation can considerably impair the mechanical stability of the carrier. After the singulation trenches 8 have been formed, damage to the carrier 3 produced as a result of the singulation is removed in the region adjoining the singulation trenches 8. This is preferably effected by means of a plasma method, in particular by means of isotropic plasma etching. As a result of the removal of the carrier material by means of the plasma method, side faces 81 are formed which delimit the completed component regions 10, in particular the carrier 3, in a lateral direction, that is to say along a main extension plane of the semiconductor layers of the semiconductor layer sequence 2.

In contrast to a film as auxiliary carrier, the rigid auxiliary carrier 6 withstands the comparatively high temperatures during a plasma method, for example 200° C. or more. Damage that occurs during singulation and could otherwise lead to a considerable impairment of the mechanical stability of the component regions 10 can therefore be removed by means of a plasma method on account of the use of the rigid auxiliary carrier.

After the singulation of the component composite assembly, a further auxiliary carrier 9 is applied on that side of the component composite assembly 1 which faces away from the auxiliary carrier 6. The auxiliary carrier 9 is expediently applied after all production steps in which comparatively high temperatures and/or a high, for example chemical, loading can occur have already been carried out.

Consequently, the further auxiliary carrier 9 does not have to fulfill any special requirements in respect of the thermal loading capacity and/or in respect of chemical stability, and so a film can also be employed for the further auxiliary carrier 9.

The component regions 10 are subsequently removed from the auxiliary carrier 6. In the exemplary embodiment shown, this is effected by means of a laser detachment method in which laser radiation is radiated in through the auxiliary carrier 6. The laser radiation 6 is illustrated by the arrows 91 in FIG. 1G.

The laser radiation passing through the auxiliary carrier 6 is absorbed in the sacrificial layer 61, which leads to a decomposition of the sacrificial layer 61 at the interface with the auxiliary carrier 6. An arrow 95 illustrates the detachment of the auxiliary carrier 6 from the component regions 10.

A laser detachment method constitutes a particular efficient and reliable way of removing the auxiliary carrier 6. In a departure from this, however, it is also conceivable to remove the auxiliary carrier mechanically, for example by means of grinding, lapping or polishing, and/or chemically, for example by means of wet-chemical or dry-chemical etching. By way of example, the sacrificial layer 61 can be decomposed by means of a wet-chemical etching method. In the case of chemical or mechanical detachment of the auxiliary carrier 6, the latter need not necessarily be embodied as radiation-transmissive. In this case, by way of example, a semiconductor material, for instance silicon, germanium or gallium arsenide, can also be employed for the auxiliary carrier 6.

Furthermore, depending on the method chosen for the detachment of the component regions from the auxiliary carrier 6, for example in the case of a mechanical method, the sacrificial layer 61 can also be dispensed with.

Figure 1G:
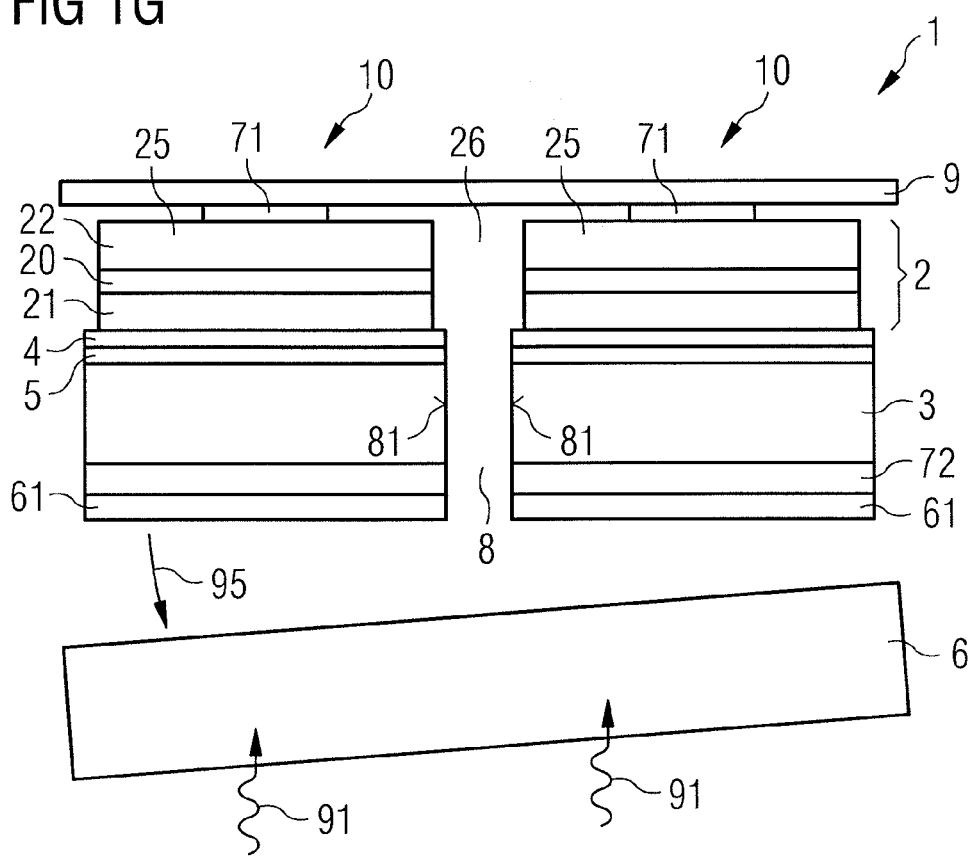
Figure 1H:
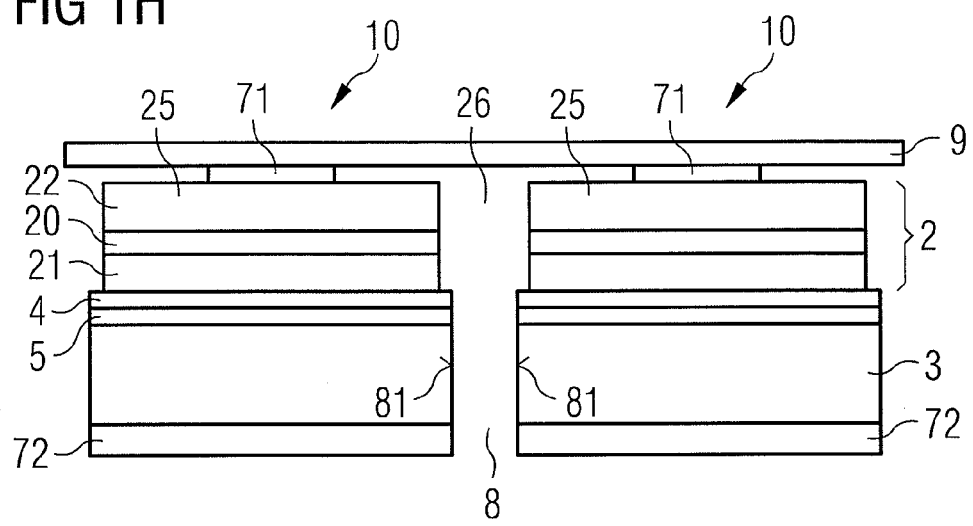

That part of the sacrificial layer 61 which remained at the component regions 10 can be removed by means of a wet-chemical etching method, for example. The component regions 10 are available, as illustrated in FIG. 1H, for further processing, for example for mounting in a housing or on a connection carrier, for instance a printed circuit board, on the further auxiliary carrier 9. On the further auxiliary carrier 9, the component regions 10 are arranged with the side facing the first contact 71.

Figure 1I:
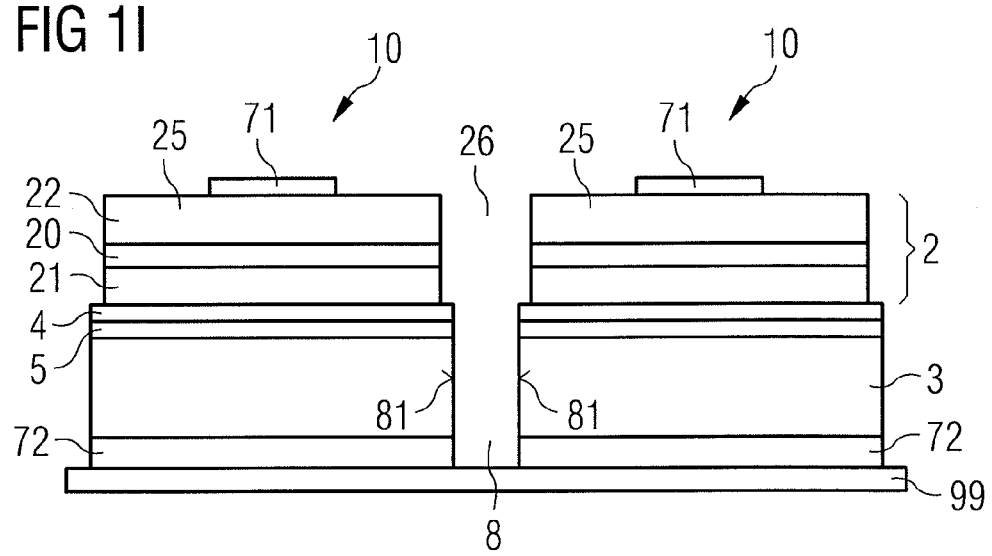

Afterward, the component regions 10 optionally, as illustrated in FIG. 1I, can be transferred to a third auxiliary carrier 99 on the side facing away from the further auxiliary carrier 9, such that the component regions are arranged on the third auxiliary carrier for further processing, for example for mounting in a housing or on a connection carrier, with the side facing the third auxiliary carrier. The further auxiliary carrier 9 can be removed. Particularly when a film is used as third auxiliary carrier, the method described therefore does not require any modification of the subsequent manufacturing steps.

The auxiliary carrier 6 is not severed during singulation and can be reused for a further singulation step after the detachment of the component regions 10 from the auxiliary carrier 6.

The method described has been shown merely by way of example for the production of thin-film semiconductor chips in which the growth substrate is removed. In a departure therefrom, the carrier 3 can also be the growth substrate for the semiconductor layer sequence 2. In this case, no connection layer is present between the semiconductor layer sequence 2 and the carrier 3. In this case, the mirror layer 4 can be embodied as a mirror layer integrated into the semiconductor layer sequence 2, for example in the form of a distributed Bragg reflector (DBR), or else omitted.

Furthermore, the formation of the semiconductor bodies 25 from the semiconductor layer sequence can also be effected only during the singulation by means of the singulation trenches 8. In this case, therefore, the singulation trenches 8 sever the semiconductor layer sequence 2 and the carrier 3.

Furthermore, the method described is largely independent of the way in which contact is made with the semiconductor layers of the semiconductor layer sequence 2. By way of example, the method is also suitable for the singulation of a component composite assembly in which electrical contact can be made with the first semiconductor layer 21 and the second semiconductor layer 22 from the side facing the carrier 3, such that a top side of the semiconductor layer sequence 2 facing away from the carrier 3 is free of an external electrical contact.

The second exemplary embodiment of a method for singulating a component composite assembly as illustrated with reference to FIGS. 2A to 2C substantially corresponds to the first exemplary embodiment described in association with FIGS. 1A to 1I. In particular, the component composite assembly 1 can be embodied as described in association with FIGS. 1A to 1C and can be fixed to the auxiliary carrier 6. The component composite assembly 1 illustrated in FIG. 2A differs from the component composite assembly illustrated in FIG. 1C merely in that the separating trenches 26 between the semiconductor bodies 25 have a smaller lateral extent transversely with respect to a main extension direction of the separating trenches.

In contrast to the first exemplary embodiment, the singulation illustrated in FIG. 2B is effected directly by means of a plasma method, in particular an anisotropic plasma etching method. The side faces 81 of the component regions 10 therefore arise directly during the singulation of the component composite assembly 1. Singulation trenches 8 produced in this way can be distinguished by a smaller lateral extent than singulation trenches produced by a laser separating method or a mechanical method. The area that can be utilized for the component regions 10 can therefore be increased with a component composite assembly of the same size. Furthermore, the geometry of the singulation trenches 8 is freely selectable within wide limits, such that component regions 10 having a basic shape that deviates from a square or rectangular shape in plan view, for example having a hexagonal basic shape, can also be produced in a simple manner. Alternatively or supplementarily, the component regions 10 can also have rounded corners in plan view, as a result of which the stability of the component regions is increased more extensively.

The further method steps can be carried out as described in association with FIGS. 1F to 1I.

As an alternative to a transfer of all the component regions 10 to the further auxiliary carrier 9, the transfer, as illustrated in FIG. 2C, can also be effected only selectively for a portion of the component regions. As illustrated in FIG. 2C, therefore, a component region 10a is transferred to the further auxiliary carrier 9, while a component region 10b initially remains on the auxiliary carrier 6. The laser detachment method described in association with FIG. 1G is suitable, in particular, for such selective transferring to the further auxiliary carrier 9. By way of example, the component regions 10a to be transferred and the component regions 10b not to be transferred can be arranged in rows, in columns or in a chequered fashion, such that a center-to-center distance between two adjacent component regions on the further auxiliary carrier 9 at least along a lateral direction is greater than the original center-to-center distance between adjacent component regions 10 on the auxiliary carrier 6 before the partial transfer.

It goes without saying that this selective transferring of individual component regions 10 as described with reference to FIG. 2C can also be employed for the first exemplary embodiment described in association with FIGS. 1A to 1I.

It has been found that component regions distinguished by a particularly high mechanical stability can be produced with the described production method by means of the use of a plasma method during singulation on a rigid auxiliary carrier. Despite the more complex transfer of the component composite assembly in comparison with the use of a flexible film as auxiliary carrier, it is therefore possible overall to improve the singulation method by means of the rigid auxiliary carrier. Furthermore, the metallization layers 721, 722 used for the metallic connection can remain in the completed component region and serve for making electrical contact with the component regions on the carrier side. An additional production step for forming the contact on the carrier side, that is to say the second contact 72, can therefore be dispensed with.

This patent application claims the priority of German Patent Application 10 2011 015 725.5, the disclosure content of which is hereby incorporated by reference.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A method for singulating a component composite assembly into a plurality of component regions comprising the following steps:
    a) providing a component composite assembly having a semiconductor layer sequence, which has an active region provided for generating or for receiving electromagnetic radiation;
    b) fixing the component composite assembly to a rigid auxiliary carrier;
    c) singulating the component composite assembly into the plurality of component regions, wherein for each component region a respective semiconductor body emerges from the semiconductor layer sequence; and
    d) removing the component regions from the rigid auxiliary carrier;
    wherein, before step d), side faces of the component regions are formed by means of a plasma method.

2. The method according to claim 1, wherein the component composite assembly is fixed on the rigid auxiliary carrier by means of a metallic connection.

3. The method according to claim 2, wherein the component regions are removed from the rigid auxiliary carrier by means of a laser detachment method.

4. The method according to claim 2, wherein, before step d), side faces of the component regions are formed by means of a plasma method.

5. The method according to claim 2, wherein the component composite assembly is singulated by means of a laser separating method.

6. The method according to claim 1, wherein the component regions are removed from the rigid auxiliary carrier by means of a laser detachment method.

7. The method according to claim 6, wherein, before step d), side faces of the component regions are formed by means of a plasma method.

8. The method according to claim 1, wherein the component composite assembly is severed by means of the plasma method during singulation in step c).

9. The method according to claim 1, wherein the side faces of the component regions are formed by means of the plasma method after the component composite assembly has been singulated in step c).

10. The method according to claim 1, wherein the component composite assembly is singulated by means of a laser separating method.

11. The method according to claim 1, wherein the component regions are removed selectively from the rigid auxiliary carrier in step d).

12. The method according to claim 1, wherein a further auxiliary carrier is applied to the component regions before step d).

13. The method according to claim 12, wherein the further auxiliary carrier is a film.

14. The method according to claim 1, wherein before step b), a sacrificial layer is applied to the rigid auxiliary carrier.

15. The method according to claim 14, wherein the sacrificial layer is at least partly decomposed in step d).

16. The method according to claim 1, wherein the rigid auxiliary carrier contains sapphire.

17. The method according to claim 1, wherein
    the component composite assembly is fixed on the rigid auxiliary carrier by means of a metallic connection;
    before step d), side faces of the component regions are formed by means of a plasma method; and
    the component regions are removed from the rigid auxiliary carrier by means of a laser detachment method.

18. A method for singulating a component composite assembly into a plurality of component regions comprising the following steps:
    a) providing a component composite assembly having a semiconductor layer sequence on a carrier, which has an active region provided for generating or for receiving electromagnetic radiation;
    b) fixing the component composite assembly including the carrier to a rigid auxiliary carrier;
    c) singulating the component composite assembly into the plurality of component regions, wherein for each component region a respective semiconductor body emerges from the semiconductor layer sequence; and
    d) removing the component regions from the rigid auxiliary carrier;
    wherein the semiconductor layer sequence is arranged on the side facing away from the rigid auxiliary carrier and wherein in step c) the carrier is severed.

19. A method for singulating a component composite assembly into a plurality of component regions comprising the following steps:
    a) providing a component composite assembly having a semiconductor layer sequence, which has an active region provided for generating or for receiving electromagnetic radiation;
    b) fixing the component composite assembly to a rigid auxiliary carrier by means of a metallic connection;
    c) singulating the component composite assembly into the plurality of component regions, wherein for each component region a respective semiconductor body emerges from the semiconductor layer sequence; and
    d) removing the component regions from the rigid auxiliary carrier.

* * * * *